(12) United States Patent
Phlippoteau et al.

(10) Patent No.: US 8,773,145 B2
(45) Date of Patent: Jul. 8, 2014

(54) METHOD FOR CHARACTERIZING AN ELECTRICAL SYSTEM BY IMPEDANCE SPECTROSCOPY

(75) Inventors: Vincent Phlippoteau, Aix en Provence (FR); Christophe Turpin, Toulouse (FR); André Rakotondrainibe, Aix-en-Provence (FR)

(73) Assignees: Helion, Aix en Provence (FR); Institut National Polytechnique de Toulouse, Toulouse (FR); Centre National de la Recherche Scientifique, Paris (FR)

( * ) Notice: Subject to any disclaimer, the term of this patent is extended or adjusted under 35 U.S.C. 154(b) by 499 days.

(21) Appl. No.: 13/202,621

(22) PCT Filed: Feb. 22, 2010

(86) PCT No.: PCT/EP2010/052175
§ 371 (c)(1),
(2), (4) Date: Nov. 16, 2011

(87) PCT Pub. No.: WO2010/097354
PCT Pub. Date: Sep. 2, 2010

(65) Prior Publication Data
US 2012/0105075 A1    May 3, 2012

(30) Foreign Application Priority Data

Feb. 24, 2009 (FR) ..................... 09 51165

(51) Int. Cl.
*G01R 27/02* (2006.01)
*G01R 23/00* (2006.01)
*G01R 23/16* (2006.01)
*G01R 31/26* (2014.01)

(52) U.S. Cl.
CPC ............... *G01R 27/02* (2013.01); *G01R 23/16* (2013.01); *G01R 23/00* (2013.01); *G01R 31/2612* (2013.01)

USPC .................... 324/600; 324/76.19; 702/76

(58) Field of Classification Search
USPC .............. 324/600, 525, 520, 430, 312, 310, 324/76.22, 76.19; 702/76, 75, 66, 57, 1
See application file for complete search history.

(56) References Cited

U.S. PATENT DOCUMENTS 5,394,084 A * 2/1995 Snyder ..................... 324/225
5,896,033 A * 4/1999 Soderkvist ................ 324/684

OTHER PUBLICATIONS

Yuan et al; "AC impedance technique in PEM fuel cell diagnosis—A review", International Journal of Hydrogen Energy, vol. 32, No. 17, Nov. 29, 2007, pp. 4365-4380, XP022369437, ISSN: 0360-3199 Cited in the International Search Report and French Preliminary Search Report.

(Continued)

*Primary Examiner* — Hoai-An D Nguyen
(74) *Attorney, Agent, or Firm* — Pearne & Gordon LLP

(57) ABSTRACT

The invention relates to a method for more precisely characterizing an electrical system by impedance spectrometry. The method consists of applying an input signal to the electrical system that comprises a sequence of sinusoidal perturbations, so as to scan a primary series (A) of frequencies; measuring an output signal of the electrical system in response to the input signal for each of the applied perturbations; and estimating a characteristic size of the impedance of the electrical system for each of the applied perturbations; wherein the perturbations of the sequence are applied so as to scan, turn by turn, a plurality of sub-series ($A^1, \ldots, A^n$) of frequencies resulting from the primary series (A), each sub-series of the plurality being interlaced with at least one other sub-series of the same plurality.

10 Claims, 4 Drawing Sheets

(56) References Cited

OTHER PUBLICATIONS

Rodrigues et al; "A review of state-of-charge indication of batteries by means of a.c. impedance measurements", Journal of Power Sources, vol. 87, No. 1-2, Apr. 1, 2000 pp. 12-20, XP004194179 ISSN: 0378-7753 Cited in the International Search Report and French Preliminary Search Report.

Huet et al; A review of impedance measurements for determination of the state-of-charge or state-of-health of secondary batteries, Journal of Power Sources, vol. 70, No. 1, Jan. 30, 1998, pp. 59-69, XP0005907566 ISSN: 0378-7753 Cited in the International Search Report and French Preliminary Search Report.

Fouquet et al; "Model based PEM fuel cell state-of-health monitoring via ac impedance measurements", Journal of Power Sources 159, 2006, pp. 905-913.

French Preliminary Search Report for FR 09 51165 dated Nov. 26, 2009.

International Search Report for PCT/EP2010/052175 dated May 20, 2010.

* cited by examiner

METHOD FOR CHARACTERIZING AN ELECTRICAL SYSTEM BY IMPEDANCE SPECTROSCOPY

TECHNICAL FIELD

The present invention relates to the general field of electrical systems, and more specifically relates to a method for characterizing said electrical system by impedance spectroscopy.

The electrical system can be an electrochemical device, such as a fuel cell, an electrolyzer, a primary or rechargeable battery, or any other type of electrical system.

BACKGROUND OF THE INVENTION

Impedance spectroscopy is a characterization technique used in many technical fields.

As an illustration, impedance spectroscopy is used in the fields of corrosion, for example to estimate the corrosion rate of a metal piece, electrodeposition, or determining a state of health of an electrochemical device such as a fuel cell.

In the latter case, the impedance spectroscopy technique can be used to detect the engorgement and drainage of a fuel cell, as described in the article by Fouquet et al. entitled "Model based PEM fuel cell state-of-health monitoring via ac impedance measurements" and published in 2006 in the Journal of Power Sources, 159, 905-913.

As shown in FIG. 1, a current ie is applied to the cell 1, which has a sequence of sinusoidal perturbations around a polarization point (FIG. 2). The current ie is applied by an active load 2 delivering a direct current on which said perturbations are superimposed. The frequency thereof is controlled by an impedance analysis device 3. The perturbations have a low amplitude and scan a large frequency range.

The voltage in response to these perturbations is measured at the terminals of the cell. The impedance analyzer 3 gives the evolution in a Nyquist plane of the imaginary part of the impedance as a function of its real part.

The perturbations are traditionally applied so as to scan a large frequency range, going from high frequencies to low frequencies, the frequencies being spaced apart logarithmically. The frequency range can go from several millihertz to several tens of kilohertz.

Thus, the high-frequency part is scanned very quickly, while for the low frequencies, the measurement time becomes non-negligible. For example, a second is sufficient to go from 10 kHz to 500 Hz with about one hundred points per decade, while several minutes are necessary for measurements of frequencies below 1 Hz.

The exploitation of the experimental data requires that the cell remain stable for the time it takes to apply said perturbations, i.e. the average value of the polarization current and that of the response voltage remain constant over time.

However, this hypothesis cannot be verified, in particular during deteriorations or temporary failures of the electrical system. As an example, the drainage and engorgement of a PEM-type fuel cell make the cell unstable, which makes it impossible to exploit the impedance measurement.

The current impedance spectroscopy technique has the drawback of not making it possible to directly identify, during scanning of the frequency range, a change in the stability condition of the electrical system.

BRIEF DESCRIPTION OF THE INVENTION

The primary aim of the present invention is to propose a method for more precisely characterizing an electrical system by impedance spectroscopy. A subsidiary aim of the invention is to simply and quickly verify the stability of said system, during scanning of the frequency range.

To that end, the invention relates to a method for characterizing an electrical system including the following steps:
applying an input signal to said electrical system that comprises a sequence of sinusoidal current or voltage perturbations, around a polarization point of said electrical system, each disruption having a different frequency belonging to a primary series of frequencies;
measuring an output signal of said electrical system in response to said input signal for each of said applied perturbations;
estimating a characteristic size of the impedance of said electrical system for each of said applied perturbations, the set of said estimates of the characteristic size of the impedance characterizing said electrical system.

According to the invention, the perturbations of said sequence are applied so as to scan, turn by turn, a plurality of sub-series of frequencies resulting from said primary series, each sub-series of said plurality being interlaced with at least one other sub-series of the same plurality.

Thus, the fact that the sub-series of frequencies are interlaced amounts to forming an overlap area between two considered sub-series, whether or not they are adjacent to each other.

The interlacing of the sub-series amounts to going back and forth in the scanning of the frequencies. Thus, during scanning of the frequencies in the primary series, the fact of again soliciting the high frequencies makes it possible to detect rapid physical phenomena. Likewise, again soliciting the low frequencies makes it possible to detect identifiable physical phenomena with long times. Thus, all throughout the measurement, it is possible to identify slow or fast physical phenomena, which makes the characterization of the electrical system more precise.

It should be noted that such precision is not obtained when one monotonously scans the frequencies of the primary series, as in the solution of the prior art previously described. In fact, once the high frequencies have been scanned, one solicits the middle and low frequencies, which also does not make it possible to detect rapid physical phenomena. Conversely, when the high frequencies are solicited and after having scanned the low frequencies, it is no longer possible to identify slow physical phenomena.

Preferably, at least one frequency of a first sub-series is situated between two consecutive frequencies of a second sub-series with which the first sub-series is interlaced.

Preferably, each sub-series of said plurality is interlaced with all of the other sub-series of the same plurality.

The perturbations of said sequence are applied so as to monotonously or randomly scan the frequencies of each sub-series.

The perturbations of said sequence are applied so as to scan monotonously, or randomly, said frequency sub-series of said plurality, the sub-series being ranked according to a predetermined order.

The sub-series can be ordered according to an increasing or decreasing ranking of the maximum frequency of each sub-series. Alternatively, the order of the sub-series can depend on the minimum frequency of each sub-series.

Preferably, the method according to the invention includes the subsequent steps consisting of:
calculating a deviation between the estimate of said characteristic size of the impedance for a first frequency of a first sub-series of said plurality of sub-series on the one hand, and a value obtained by interpolation, for the same first frequency, of the estimates of said characteristic size for two consecutive frequencies of a second sub-series of the same plurality on the other hand, between which said first frequency is situated;

detecting an instability of the electrical system when said calculated deviation exceeds a predetermined threshold deviation.

Thus, the method according to the invention makes it possible to simply and quickly verify the stability of the electrical system, during scanning of the frequency range of the primary series.

A discontinuity in the values of the impedance situated in this overlap area, detected when said calculated deviation exceeds a threshold deviation, directly shows the instability of the studied electrical system. The stability of the electrical system can therefore be verified simply and quickly.

Said electrical system can be any electrochemical device such as, for example, an electrolyzer or a fuel cell.

The invention also relates to a method for controlling an electrical system, including:

performing the characterization method according to any one of the preceding features, to characterize said electrical system by the set of said estimates of the characteristic size of the impedance; then measuring a deviation between at least one of said estimates of the characteristic size of the impedance of said electrical system and at least one reference value of said size; then applying a command to said electrical system when said measured deviation exceeds a predetermined threshold deviation.

Other advantages and features of the invention will appear in the non-limiting detailed description below.

BRIEF DESCRIPTION OF THE DRAWINGS

We will now describe, as non-limiting examples, embodiments of the invention, in reference to the appended drawings, in which.

DETAILED DESCRIPTION OF THE INVENTION

Figure 1:
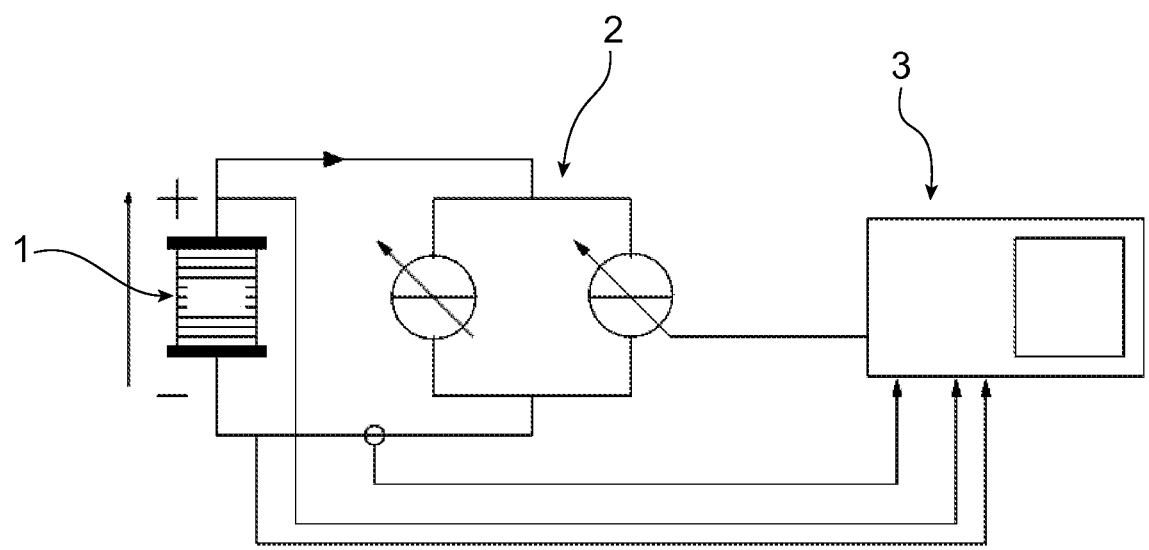
FIG. 1, already described, is a diagrammatic illustration of a fuel cell connected to a current source and an impedance analyzer.
Figure 2:
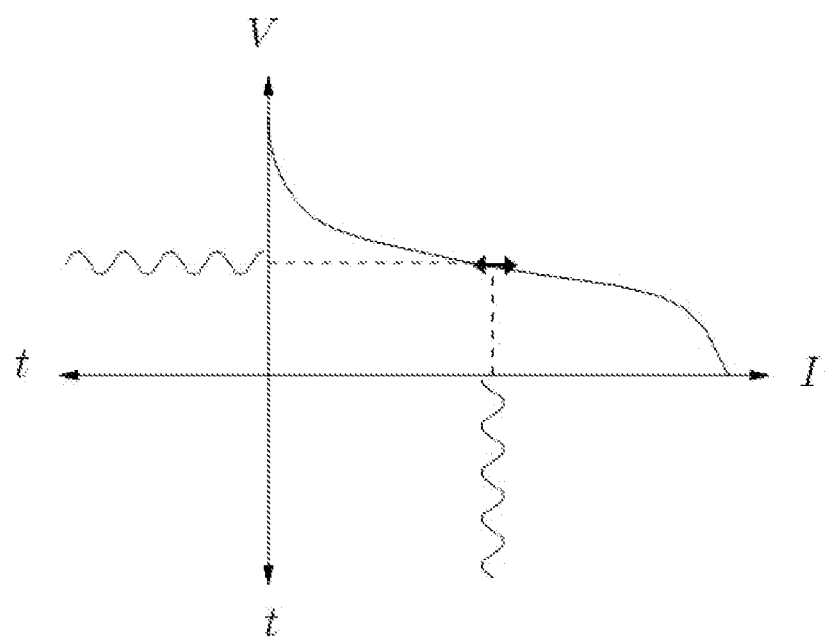
FIG. 2, already described, is a graph showing the application of a current disruption to the fuel cell of FIG. 1, around a polarization point.

The electrical system is, in the rest of the description, a fuel cell of the proton exchange membrane type.

The electrical system is not, however, limited to a fuel cell, but can be an electrolyzer, a primary or rechargeable battery, any other type of electrochemical device, as well as any electrical system that can receive or feed electrical energy.

The fuel cell is connected to a power device making it possible to impose an electrical current, such as an active load or a static converter as interface with an application. The active load has a bandwidth covering at least the series of frequencies to be studied.

The cell is connected to an impedance analysis device. This can be a commercial impedance analyzer, a computer including synchronous cards for generating and acquiring current and/or voltage, which may or may not be onboard.

A sequence of sinusoidal current perturbations is applied to the fuel cell, around a polarization point.

The polarization point preferably remains constant over the entire application length of the sequence of perturbations.

Each disruption preferably comprises several periods so that any transient state is damped, then several periods to calculate the impedance.

Each disruption has a different frequency, such that the disruption sequence scans a primary series A of frequencies $A=\{f_1, f_2, \ldots, f_N\}$. More precisely, the series of perturbations includes at least one disruption for each frequency of the series A.

The range of the primary series A of frequencies can go from several millihertz to several tens of kilohertz, and comprises N frequencies to be scanned, for example, around one hundred frequencies.

The amplitude of the perturbations is low enough for the cell's response to remain linear. To that end, the amplitude is substantially below 10% of the value of the current at the considered operating point, and is preferably in the vicinity of a percent of said value.

An impedance analysis device gives the complex impedance of the cell for each of the frequencies of the primary series A. It is then possible to trace the evolution of the imaginary part of the impedance as a function of the real part in a Nyquist plane.

It should be noted that, in the case where the input signal is the voltage at the terminals of the cell, the impedance analysis device deduces the complex admittance of the cell, and no longer the complex impedance. The impedance can nevertheless be easily deduced from the admittance.

According to the invention, the frequencies of said primary series A are distributed so as to form a plurality of sub-series $A^1, \ldots, A^n$ of frequencies.

Sub-series $(A^1)_{i=1 \ldots n}$ of frequencies refers to a set of frequencies extracted, or resulting, from the primary series A:

$$A^i = \{f_j^i / f_j^i \in A\}$$

The union of the sub-series $(A^1)_{i=1 \ldots n}$ corresponds to the primary series A of frequencies:

$$A = \bigcup_{i=1}^{n} A^i$$

Preferably, each sub-series does not contain frequencies shared with another sub-series:

$$\bigcap_{i=1}^{n} A^i = \emptyset$$

Preferably, each sub-series $(A^1)_{i=1 \ldots n}$ of frequencies includes $N^i$ frequencies, so that the sum of the $N^i$ frequencies equals the number N of frequencies of the primary series A:

$$\sum_{i=1}^{n} N^i = N$$

Each sub-series $A^1$ has a range of frequencies. Range $G^i$ of the sub-series $A^i$ refers to the set of frequencies of the sub-series considered to be comprised between the highest frequency and the lowest frequency of said sub-series. Thus:

$$G^i = \{f_j^i / \forall j \in [1, N^i], f_{(min)}^i \leq f_j^i \leq f_{(max)}^i\}$$

with $$f_{(min)}^i = \min(A_i) \, f_{(max)}^i = \max(A_i)$$

Each sub-series $A^i$ of said plurality of sub-series is interlaced with at least one other sub-series $A^{i'}$ of the same plurality.

Interlacing of two sub-series $A^i$ and $A^{i'}$ refers to the presence of at least one frequency of a first sub-series between two consecutive frequencies of the second sub-series.

More precisely, there is interlacing between the sub-series $A^i$ and $A^{i'}$ such that $$A^i = \{f_j^i\}_{j \in [1, N^i]} \text{ et } A^{i'} = \{f_k^{i'}\}_{k \in [1, N^{i'}]}$$

if $$\exists j_0 / f_k^{i'} \leq f_{j_0}^i \leq f_{k+1}^{i'}$$

or if:

$$\exists k_0 / f_j^i \leq f_{k_0}^{i'} \leq f_{j+1}^i$$

In the first embodiment of the invention, each sub-series is interlaced with all of the other sub-series of said plurality.

Each sub-series is traveled through by the sequence of perturbations monotonously, in the same direction, preferably from the high frequencies toward the low frequencies.

Moreover, said plurality of sub-series of frequencies is traveled through monotonously. Monotonous order means that the plurality of sub-series of frequencies is traveled through from sub-series to adjacent sub-series, following an ordered ranking of the sub-series. Preferably, said sub-series are ranked according to decreasing order of the maximum frequency of each sub-series.

Figure 3A:
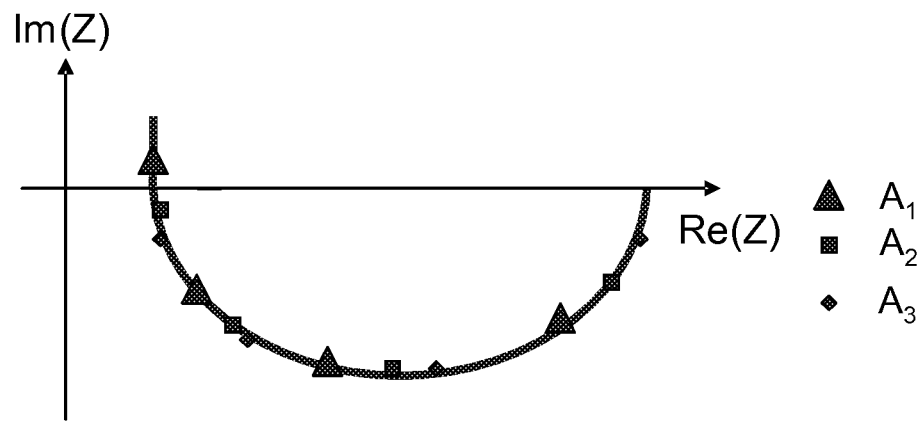
FIGS. 3A and 3B are graphs showing the evolution of the impedance as a function of the applied perturbations, in case of stability (FIG. 3A) and instability (FIG. 3B) of the electrical system.
Figure 3B:
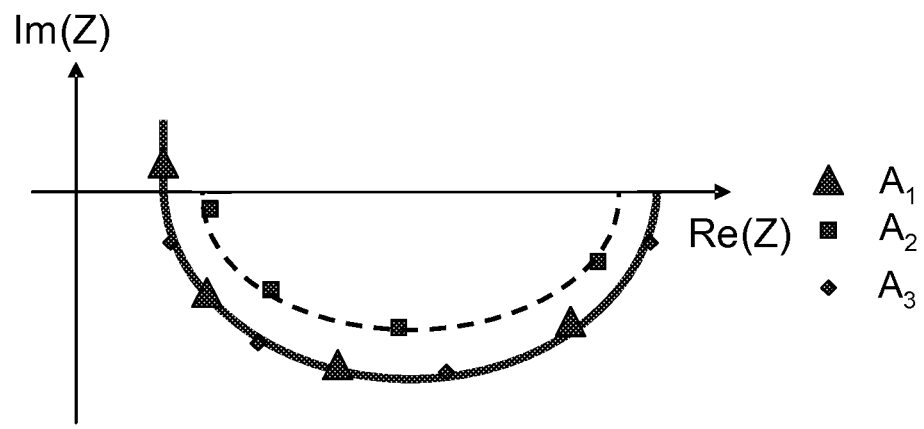

As an example, and as illustrated by FIGS. 3A and 3B, the primary series A of frequencies to be scanned is from 2 Hz to 10 kHz, and includes 12 frequencies. Thus, the series A is: A={10 kHz, 5 kHz, 2 kHz, 1 kHz, 500 Hz, 200 Hz, 100 Hz, 50 Hz, 20 Hz, 10 Hz, 5 Hz, 2 Hz}.

Three sub-series $A^1$, $A^2$, $A^3$ are formed from the primary series A by decimation of one out of three frequencies:
$A^1 = \{10 \text{ kHz}, 1 \text{ kHz}, 100 \text{ Hz}, 10 \text{ Hz}\}$
$A^2 = \{5 \text{ kHz}, 500 \text{ Hz}, 50 \text{ Hz}, 5 \text{ Hz}\}$
$A^3 = \{2 \text{ kHz}, 200 \text{ Hz}, 20 \text{ Hz}, 2 \text{ Hz}\}$ According to this embodiment, each sub-series of frequencies has at least one frequency comprised between two consecutive frequencies of another sub-series. There is therefore interlacing between each of the three sub-series, and not only between two adjacent sub-series.

Thus, instead of applying the sequence of perturbations so as to continuously scan the N frequencies of the primary series A, as in the traditional solution of the prior art described before, the sequence of perturbations travels turn by turn through the three sub-series of frequencies.

The sequence of perturbations preferably travels successively through the frequencies of sub-series $A^1$, then those of sub-series $A^2$, etc.

Thus, by interlacing said sub-series, the method makes it possible to know quickly whether the sub-system has remained stable throughout the duration of the measurements.

In fact, in case of instability of the fuel cell, upon application of the sub-series $A^i$, the experimental points of the impedance for the frequencies of said sub-series are not situated in the continuation of the points corresponding to the impedance measured for the preceding sub-series $A^{i-1}$.

For example, as illustrated by FIGS. 3A and 3B, the application of the perturbations scanning the sub-series $A^1$ makes it possible to obtain the values of the impedance $Z(A^1)$ for the considered frequencies: Z(10 kHz), Z(1 kHz), Z(100 Hz) . . . .

The values of the impedance $Z(A^2)$ for the frequencies of the sub-series $A^2$ should, if the cell has stayed stable throughout the measuring time, be placed in the continuation of those of $Z(A^1)$. As shown by FIG. 3A (stable cell), the values of the impedance for each sub-series of frequencies is placed continuously along a given curve (solid line).

If the cell becomes unstable between sub-series $A^1$ and $A^2$, a discontinuity appears between $Z(A^1)$ and $Z(A^2)$ in the overlap area between the ranges of these two sub-series. FIG. 3B illustrates this discontinuity. The values of $Z(A^2)$ are placed on a curve (broken line) different from that of $Z(A^1)$ (solid line). The discontinuity appears as of the first value of $Z(A^2)$ corresponding to the first applied frequency of the sub-series $A^2$.

It is possible to simply evaluate the discontinuity in the considered overlap area. Thus, a first frequency $f^1_i$ of a first sub-series $A^1$ is situated between two consecutive frequencies $f^2_j$ and $f^2_{j+1}$ of a second sub-series $A^1$ and $A^2$ are therefore interlaced.

One then calculates a value of the impedance for the first frequency $Z_{int}(f^1_i)$ from impedances corresponding to the two frequencies $Z(f^2_j)$ and $Z(f^2_{j+1})$ of the second sub-series. This calculation can be done, for example, by linear, cubic (by cubic spline) or polynomial interpolation.

One then calculates a deviation between the estimated value of the impedance for a first frequency $Z(f^1_i)$ and the value of the impedance obtained by interpolation $Z_{int}(f^1_i)$.

One lastly compares the calculated deviation with a predetermined threshold deviation. When this deviation exceeds the threshold deviation, an instability of the fuel cell is deduced therefrom.

Thus, the sequence of perturbations makes it possible to know quickly whether the system has remained stable throughout the duration of the measurements.

Moreover, again soliciting the high frequencies, here at the beginning of each sub-series, makes it possible to identify any rapid physical phenomena all throughout the measurement.

Of course, this example is only provided as an illustration. It is possible to increase or decrease the number of sub-series, and therefore to respectively decrease or increase the number of frequencies in each sub-series.

For example, for a primary series A including 400 frequencies, the sequence of perturbations can travel through approximately twenty sub-series of frequencies each including approximately twenty frequencies.

According to a second embodiment of the invention, each sub-series $A^i$ of frequencies is only interlaced with the adjacent sub-series $A^{i-1}$ and $A^{i+1}$. With the exception of this difference, the second embodiment remains similar to the first embodiment.

Figure 4:
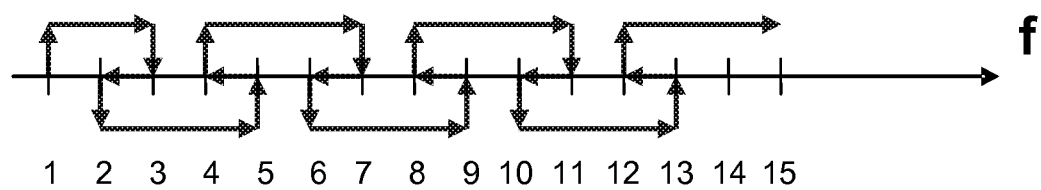
FIG. 4 is an example of interlacing of the scanned frequencies by a sequence of perturbations.

As an example, for the following primary series A={10 kHz, 5 kHz, 2 kHz, 1 kHz, 500 Hz, 200 Hz, 100 Hz, 50 Hz, 20 Hz, 10 Hz, 5 Hz, 2 Hz}, the sub-series can be:
$A^1 = \{10 \text{ kHz}, 2 \text{ kHz}\}$
$A^2 = \{5 \text{ kHz}, 500 \text{ Hz}\}$
$A^3 = \{1 \text{ kHz}, 100 \text{ Hz}\}$
$A^4 = \{200 \text{ Hz}, 20 \text{ Hz}\}$
$A^5 = \{50 \text{ Hz}, 5 \text{ Hz}\}$
$A^6 = \{10 \text{ Hz}, 2 \text{ Hz}\}$ The sequence of perturbations scans the sub-series turn by turn, following the decreasing order of the maximum frequencies, as in FIG. 4, which illustrates an example of interlacing of the frequencies for the second embodiment of the invention.

Thus, the sequence of perturbations involves a succession of back and forth movements, while going gradually from the high frequencies towards the low-frequencies.

As previously described, in case of instability of the cell, a discontinuity in the values of the impedance appears at the overlap areas between the adjacent sub-series.

This discontinuity can be exploited to diagnose a budding defect, such as for example drainage or engorgement of a fuel cell, and to lead to retroaction on the control-command of the fuel cell.

For the different embodiments described earlier, the frequencies of each sub-series $A^i$ can be scanned no longer monotonously, but randomly, by said sequence of perturbations.

Likewise, said plurality of sub-series of frequencies $A^1, \ldots, A^n$ can be traveled through randomly by said sequence of perturbations.

It should be noted that interlaced spectroscopy, irrespective of the embodiments previously described, has a result identical, when the cell remains stable, to that of traditional spectroscopy.

The invention claimed is:

1. A method for characterizing an electrical system including the following steps:
    applying an input signal to said electrical system that comprises a sequence of sinusoidal current or voltage perturbations, around a polarization point of said electrical system, each disruption having a different frequency belonging to a primary series (A) of frequencies;
    measuring an output signal of said electrical system in response to said input signal for each of said applied perturbations;
    estimating a characteristic size of the impedance of said electrical system for each of said applied perturbations, the set of said estimates of the characteristic size of the impedance characterizing said electrical system,
    wherein the perturbations of said sequence are applied so as to scan, turn by turn, a plurality of sub-series $(A^1, \ldots, A^n)$ of frequencies resulting from said primary series (A), each sub-series of said plurality being interlaced with at least one other sub-series of the same plurality.

2. The method according to claim 1, wherein at least one frequency of a first sub-series is situated between two consecutive frequencies of a second sub-series with which the first sub-series is interlaced.

3. The method according to claim 1 or 2, wherein each sub-series of said plurality is interlaced with all of the other sub-series of the same plurality.

4. The method according to any one of claims 1 to 3, wherein the perturbations of said sequence are applied so as to monotonously or randomly scan the frequencies of each sub-series $(A^i)$.

5. The method according to any one of claims 1 to 3, wherein the perturbations of said sequence are applied so as to randomly scan the frequencies of each sub-series $(A^i)$.

6. The method according to any one of claims 1 to 5, wherein the sub-series are ranked according to a predetermined order, the perturbations of said sequence being applied so as to monotonously scan said sub-series $(A^1, \ldots, A^n)$ of said plurality.

7. The method according to any one of claims 1 to 5, wherein the sub-series are ranked according to a predetermined order, the perturbations of said sequence being applied so as to randomly scan said sub-series $(A^1, \ldots, A^n)$ of said plurality.

8. The method according to any one of claims 1 to 7, wherein it includes the subsequent steps consisting of:
    calculating a deviation between the estimate of said characteristic size of the impedance for a first frequency of a first sub-series of said plurality of sub-series on the one hand, and a value obtained by interpolation, for the same first frequency, of the estimates of said characteristic size for two consecutive frequencies of a second sub-series of the same plurality on the other hand, between which said first frequency is situated;
    detecting an instability of the electrical system when said calculated deviation exceeds a predetermined threshold deviation.

9. The method according to any one of the preceding claims, wherein said electrical system is a fuel cell.

10. A method for controlling an electrical system, including:
    performing the characterization method according to any one of the preceding claims, to characterize said electrical system by the set of said estimates of the characteristic size of the impedance; then
    measuring a deviation between at least one of said estimates of the characteristic size of the impedance of said electrical system and at least one reference value of said size; then
    applying a command to said electrical system when said measured deviation exceeds a predetermined threshold deviation.

* * * * *

UNITED STATES PATENT AND TRADEMARK OFFICE
CERTIFICATE OF CORRECTION

PATENT NO. : 8,773,145 B2  
APPLICATION NO. : 13/202621  
DATED : July 8, 2014  
INVENTOR(S) : Phlippoteau Page 1 of 1

It is certified that error appears in the above-identified patent and that said Letters Patent is hereby corrected as shown below:

In the Spec: column 4, line 40, please replace "$A^i = \{f_f^i / f_j^i \in A\}$,"

with -- $A^i = \{f_j^i / f_j^i \in A\}$ --

Signed and Sealed this  
Eleventh Day of November, 2014

Michelle K. Lee  
*Deputy Director of the United States Patent and Trademark Office*